United States Patent
Chan et al.

(10) Patent No.: US 6,352,741 B1
(45) Date of Patent: Mar. 5, 2002

(54) PLANAR HIGH TEMPERATURE SUPERCONDUCTIVE INTEGRATED CIRCUITS FOR USING ION IMPLANTATION

(75) Inventors: Hugo W. K. Chan; Arnold H. Silver, both of Rancho Palos Verdes, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 08/423,766

(22) Filed: Apr. 17, 1995

Related U.S. Application Data

(62) Division of application No. 08/183,097, filed on Jan. 14, 1994, now abandoned.

(51) Int. Cl.[7] .............................. B05D 5/12; C23C 14/08; H01L 39/24
(52) U.S. Cl. .......................... 427/62; 427/63; 427/526; 427/529; 505/220; 505/325
(58) Field of Search .................... 505/325, 220; 427/62, 63, 526, 529

(56) References Cited

U.S. PATENT DOCUMENTS

| | | |
|---|---|---|
| 4,536,781 A | 8/1985 | Kroger |
| 5,026,682 A | 6/1991 | Clark et al. |
| 5,051,396 A | 9/1991 | Yamazaki |
| 5,084,265 A | 1/1992 | Harada et al. |
| 5,096,882 A | 3/1992 | Kato et al. |
| 5,098,884 A | 3/1992 | Yamazaki |
| 5,106,823 A | 4/1992 | Creuzet et al. |
| 5,194,419 A | 3/1993 | Shiga et al. |
| 5,229,360 A | 7/1993 | Shiga et al. |
| 5,229,361 A | 7/1993 | Shiraishi et al. |
| 5,547,922 A | * 8/1996 | Ma .............................. 505/325 |

* cited by examiner

*Primary Examiner*—Bret Chen
(74) *Attorney, Agent, or Firm*—Harness, Dickey & Pierce, P.L.C

(57) ABSTRACT

High temperature superconductive (HTS) integrated circuits can be fabricated in three ways according to the invention. First, a planar multiple layer HTS integrated circuit is fabricated using multiple HTS layers. The layers include altered regions which have been bombarded using ion implantation to destroy superconductivity of the altered regions without interrupting the lattice structure of the altered regions. Second, a planar multiple-layer HTS integrated circuit includes upper and lower HTS layers, each including central and opposing regions. A first implant energy is used to destroy superconducting properties of the opposing regions of the lower HTS layer without interrupting the lattice structure. A second implant energy is used to destroy superconducting properties of a top portion of the central region to define a contact. Third, a HTS integrated circuit is formed from a single HTS layer using three ion implantation steps and ions having first, second and third energies and range.

3 Claims, 2 Drawing Sheets

# PLANAR HIGH TEMPERATURE SUPERCONDUCTIVE INTEGRATED CIRCUITS FOR USING ION IMPLANTATION

This is a divisional of U.S. patent application Ser. No. 08/183,097 filed Jan. 14, 1994 now abandoned.

BACKGROUND OF THE INVENTION

1. Technical Field

This invention relates to high temperature superconductive integrated circuits and, more particularly, to planar high temperature superconductive integrated circuits fabricated using ion implantation.

2. Discussion

High temperature superconductor (HTS) integrated circuits typically include a first HTS layer patterned and deposited on a substrate using photo-lithography. Unwanted portions of the first HTS layer are physically etched off using a variety of techniques, for example ion milling, reactive ion etching, plasma etching, and wet etching. An insulating dielectric layer is formed over the HTS layer. Then, a second HTS layer is patterned and deposited. Additional dielectric layers and HTS layers can be alternately formed on the second HTS layer.

To effectively grow the second HTS layer, the underlying dielectric layer has to be monocrystalline or highly oriented (in contrast to polycrystalline or amorphous). However, it is very difficult to grow the epitaxial dielectric layer on the patterned first HTS layer since a lattice match is required between the dielectric layer and two distinctly different surfaces, the substrate layer the first HTS layer. In addition to providing the lattice match, proper crystal growth must be maintained by an angled portion formed over edges of the first HTS layer.

Stress, thickness, uniformality and conformality of the dielectric layer must also be considered. A short circuit could occur between the first and second HTS layers through the dielectric layer near edges of the first layer. Furthermore, since the second HTS layer is deposited over the non-planar dielectric layer (primarily where the second HTS layer crosses over the first HTS layer), the second HTS layer could break, develop line discontinuity, and/or encounter significant reduction in supercurrent carrying ability ($J_c$) due to crystal orientation disruption and/or non-uniform crystal thickness (e.g. crystal too thin) near the edges of the first layer. The problems described above increase as additional dielectric and HTS layers are formed.

Therefore, a high temperature superconductive integrated circuit addressing the above-identified problems is desirable.

When the first HTS layer, the dielectric layer and the second HTS layer are deposited in separate steps, contact can be made between the first and second HTS layers through a contact hole in the dielectric layer. A top interface surface of first HTS layer is typically cleaned using chemical etching or ion-cleaning before the second HTS layer is patterned and deposited. Such cleaning can damage or alter the top interface surface of the first HTS layer and can create a thin non-superconducting layer resulting in decreased supercurrent carrying ability ($J_c$) or nonsuperconductivity.

SUMMARY OF THE INVENTION

A multi-layer planar high temperature superconducting integrated circuit formed on a substrate includes a first planar high temperature superconducting (HTS) layer deposited and patterned on the substrate and including a central region and two opposing regions abutting the central region. Ion implantation is used to destroy superconductivity in the opposing regions without interrupting the lattice structure of the opposing regions. A second planar HTS layer is deposited and patterned on the first HTS layer and includes a central region and two opposing regions abutting the central region. Ion implantation is used to destroy superconductivity in the opposing regions without interrupting the lattice structure of the opposing regions. A third planar HTS layer is deposited and patterned over the second HTS layer.

According to another embodiment of the invention, a multi-layer planar high temperature superconducting integrated circuit is formed on a substrate and includes a first planar high temperature superconducting (HTS) layer deposited and patterned on the substrate and including a central region and two opposing regions abutting the central region. Ion implantation at a first implant energy level is used to destroy superconductivity in the opposing regions without interrupting the lattice structure ion of the opposing regions. Ion implantation at a second energy level lower than the first implant energy level is used to destroy superconductivity of a top portion of the central region without destroying the lattice structure of the top portion and to define a contact. A second HTS layer is deposited and patterned over the first HTS layer and abuts the opposing regions of the first layer, the contact, and the top portion.

According to another embodiment of the invention, a planar high temperature superconducting integrated circuit is formed on a substrate and includes a first high temperature superconducting layer deposited and patterned on the substrate. The HTS layer includes a lower portion having opposing regions abutting a central region. The opposing regions have been bombarded using ion implantation with high-energy, deep-range ions to destroy superconductivity of the opposing region of the lower portion. A middle portion has opposing regions abutting a central region. The opposing regions have been bombarded using ion implantation with medium-energy, medium-range ions to destroy superconductivity of the opposing regions of the middle portion. An upper portion includes a central superconducting region.

Other objects, features and advantages will be readily apparent.

BRIEF DESCRIPTION OF THE DRAWINGS

The various advantages of the present invention will become apparent to those skilled in the art after studying the following specification and by reference to the drawings in which.

DESCRIPTION OF THE PREFERRED EMBODIMENTS

Figure 1:
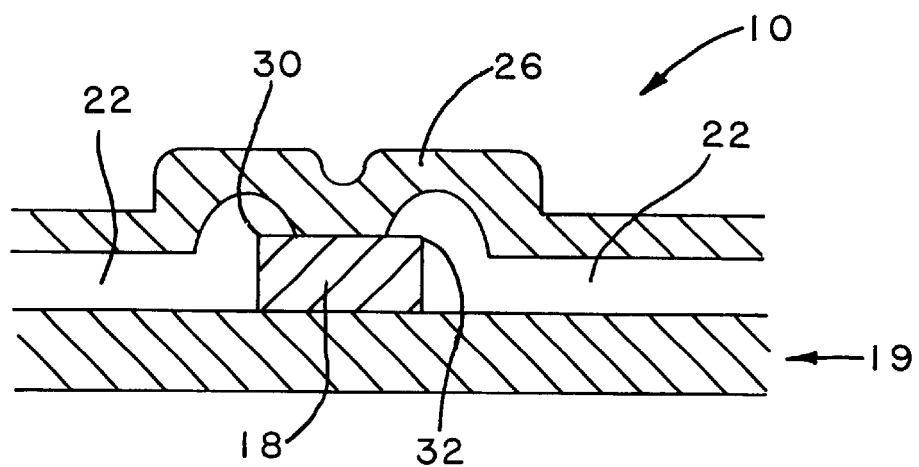
FIG. 1 illustrates a cross-sectional view of a high temperature superconducting (HTS) integrated circuit according to the prior art and including a first HTS layer which contacts a second HTS layer in a contact area formed by a dielectric layer.

Referring to FIG. 1, a high temperature superconducting (HTS) integrated circuit 10 according to the prior art includes a first HTS layer 18 deposited and patterned on substrate 19, for example, using photo-lithography. The HTS layers can be made of Yttrium-Barium-Copper-Oxygen (Y—Ba—Cu—O), Bismuth-Strontium-Calcium-Copper-Oxygen (Bi—Sr—Ca—Cu—O), and Thallium-Barium-Calcium-Copper-Oxygen (Tl—Ba—Ca—Cu—O). Other materials will be readily apparent.

Unwanted portions of HTS layer 18 are physically etched using a variety of techniques, for example ion milling, reactive ion etching, plasma etching, and wet etching. As can be appreciated, other etching and liftoff techniques are also used. An insulating dielectric layer 22 is deposited and patterned over first HTS layer 18. Dielectric layer 22 can be made using $SrTiO_3$, and $LaAlO_3$. Other materials will be readily apparent. Then, a second HTS layer 26 is deposited and patterned over dielectric layer 22. As can be seen in FIG. 1, second HTS layer 26 contacts first HTS layer 18 along a top surface of first HTS layer 18. Additional dielectric layers and HTS layers can be alternately formed on second HTS layer 26, as described above, if desired.

To effectively grow second HTS layer 26, underlying dielectric layer 22 should be epitaxial, in other words monocrystalline or highly oriented (in contrast to polycrystalline or amorphous). However, it is very difficult to grow epitaxial dielectric layer 22 on first HTS layer 18 since a lattice match is required between dielectric layer 22 and two distinctly different surfaces, substrate 19 and first HTS layer 18. In addition to providing the lattice match, proper crystal growth must be maintained over edges 30 and 32 of first HTS layer 18.

Stress, thickness, uniformality and conformality of dielectric layer 22 must also be considered. A short could occur between first and second HTS layers 18 and 26 through dielectric layer 22 near edges 30 and 32 of first layer 18 decreasing performance of HTS integrated circuit 10. Furthermore, since second HTS layer 26 is deposited and patterned over non-planar dielectric layer 22 (primarily where second HTS layer 26 crosses over first HTS layer 18), second HTS layer 26 could break, develop line discontinuity, and/or encounter significant reduction in supercurrent carrying ability ($J_c$) due to crystal orientation disruption and/or non-uniform crystal thickness (crystal thinning). The problems described above increase as additional dielectric and HTS layers are formed.

When first HTS layer 18, dielectric layer 22, and second HTS layer 26 are deposited and patterned in separate steps, contact between first and second HTS layers 18 and 26 is made through a contact hole in dielectric layer 22. A top interface surface of first HTS layer 18 is typically cleaned using chemical etching or ion-cleaning before second HTS layer 26 is deposited and patterned. Such cleaning can damage or alter the top interface surface of first HTS layer 18 and can create a thin non-superconducting layer. The thin non-superconducting layer can result in a non-superconducting contact or a superconducting contact with a low supercurrent carrying capacity ($J_c$)

Figure 2:
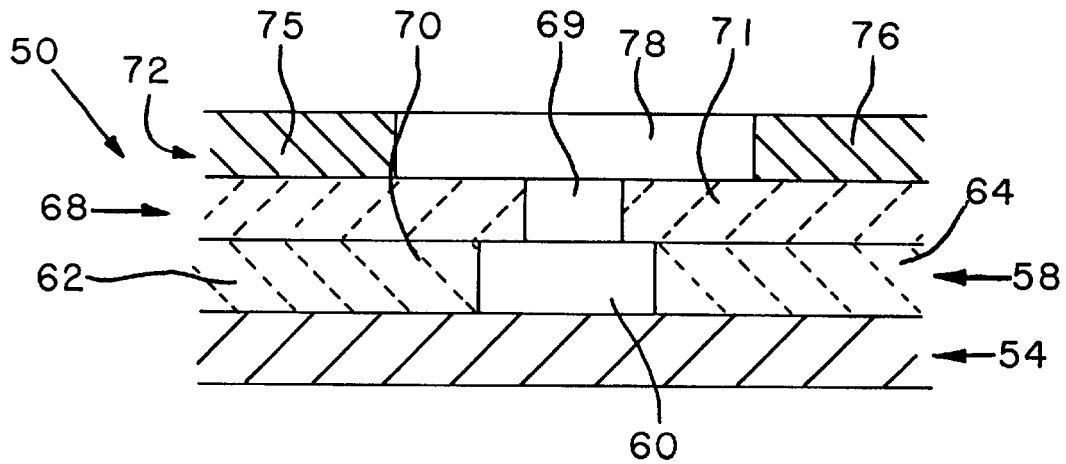
FIG. 2 illustrates a cross-sectional view of a first multi-layer planar HTS integrated circuit according to the invention.

Referring to FIG. 2, a first HTS integrated circuit 50 according to the invention includes a substrate 54, a first HTS layer 58 including an unaltered HTS region 60 and altered HTS regions 62 and 64, a second HTS or dielectric/contact layer 68 including an unaltered HTS region 69 and altered HTS regions 70 and 71, and a third HTS layer 72.

First HTS layer 58 can be initially deposited and patterned, for example, using photo-lithography techniques described above. Other techniques will be readily apparent. Regions 62 and 64 of first HTS layer 58 are exposed using ion implantation to alter superconductive properties of regions 62 and 64 and to create altered HTS regions 62 and 64, while unaltered HTS region 60 retains superconducting properties.

Second HTS layer 68 can also be deposited and patterned using photo-lithography techniques. Regions 70 and 71 are exposed to ion implantation to alter superconducting properties of regions 70 and 71, while unaltered region 69 retains superconducting properties. Unaltered region 69 operate as a contact while altered regions 70 and 71 operate as a dielectric.

Third HTS layer 72 is then deposited and patterned on planar dielectric/contact layer 68 to complete first HTS integrated circuit 50. If additional layers are desired, additional dielectric layers and HTS layers can be deposited and patterned on planar dielectric layer 68. Ion implantation can also be used on third HTS layer 72 to create altered regions 75 and 76 and unaltered region 78 if desired in a manner analogous to first HTS layer 58 previously described. Regions 75 and 76 can also be removed using a wet or dry etch step if desired (for example, reactive ion etching, ion milling, etc.) instead of implanting third HTS layer 72.

As can be appreciated, a photoresist/mask can be used during ion implantation to delineate altered and unaltered regions. Other techniques can also be employed. Prior to depositing and patterning planar dielectric/contact layer 68 on planar HTS layer 58 or to depositing and patterning third HTS layer 72, an annealing step can be performed on first HTS layer 58 and/or second HTS (or dielectric/contact) layer 68 to anneal out ion implant damage, to activate chemical bonding between the implant species and oxygen in the altered HTS regions, and to minimize out-diffusion of implanted dopant from the altered HTS regions to the unaltered HTS region.

First HTS integrated circuit 50 uses ion-implantation techniques to alter superconducting properties of planar HTS regions instead of physically removing the regions using etching or liftoff techniques. As a result, planar surfaces are provided for subsequent layers. The ion implant species are selected to change the chemical and electrical properties of the regions to be altered without interrupting the lattice structure. Such ion implantation without destroying the lattice structure is disclosed in U.S. Pat. No. 5,194,419 to Shiga et al which is hereby incorporated by reference.

For example, the implant species can be chosen to form stable chemical bonds with oxygen atoms in the Copper-Oxide plane of HTS Perovskite thereby reducing the number of oxygen atoms available to Perovskite unit cells to convert the conducting properties of the implanted regions to non-superconducting. Converting the altered regions to non-superconducting by using ion implantation which damages the crystal lattice is unacceptable since the crystal lattice structure of the altered regions must be maintained so that additional HTS layers can be deposited and patterned thereon.

Figure 3:
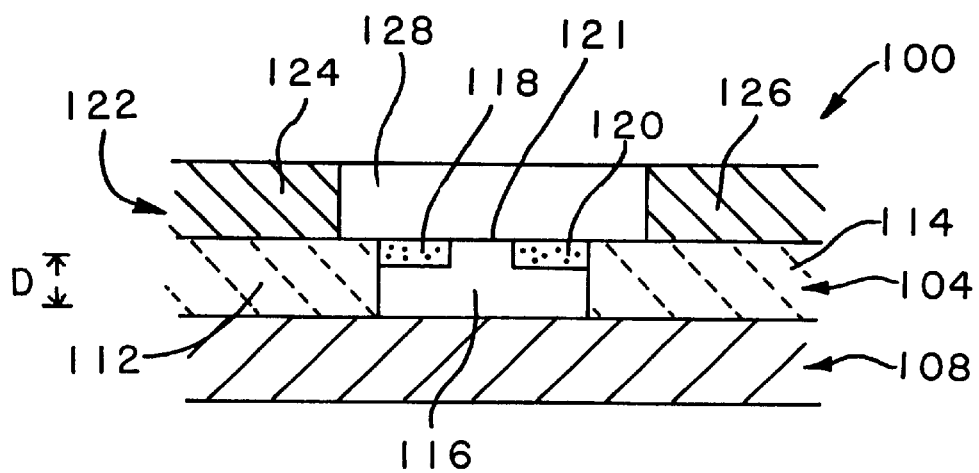
FIG. 3 illustrates a cross-sectional view of a second multi-layer planar HTS integrated circuit according to the invention.

Referring to FIG. 3, a second HTS integrated circuit 100 according to the invention is illustrated. A first HTS layer 104 is deposited and patterned on a substrate 108 using photo-lithography. Using a first mask, first and second regions 112 and 114 of the first HTS layer 104 are exposed to ion implantation (using a first implant energy level) to neutralize superconducting properties thereof. Using a second mask, a top portion of region 116 is implanted using a second implant energy lower than the first implant energy used for altered HTS regions 112 and 114 to define altered portions 118 and 120 and a contact 121. Since the ions are implanted at the lower second implant energy, the ions penetrate only part of a thickness "D" of HTS layer 104. Altered portions 118 and 120 are converted to a dielectric or a high-resistance non-superconducting layer. A second HTS layer 122 is deposited and patterned on planar first layer 104. Annealing can be performed prior to forming second HTS layer 122.

Altered regions 124 and 126 and unaltered region 128 can be defined in second HTS layer 122 as previously described in conjunction with HTS layer 72 in FIG. 2. Alternately, regions 124 and 126 of HTS layer 122 can be removed using wet or dry etching. Implant species used for first and second HTS integrated circuits 50 and 100 should have a low diffusion length in the material chosen for the HTS layers since temperature cycling between 600–800 degrees Celsius occurs during formation of subsequent dielectric and/or HTS layers. As can be appreciated, planar HTS integrated circuits 50 and 100 reduce the likelihood of short circuits, line discontinuity, breakage, and reduction in superconducting carrying ability ($J_c$) over conventional HTS integrated circuits.

Figure 4:
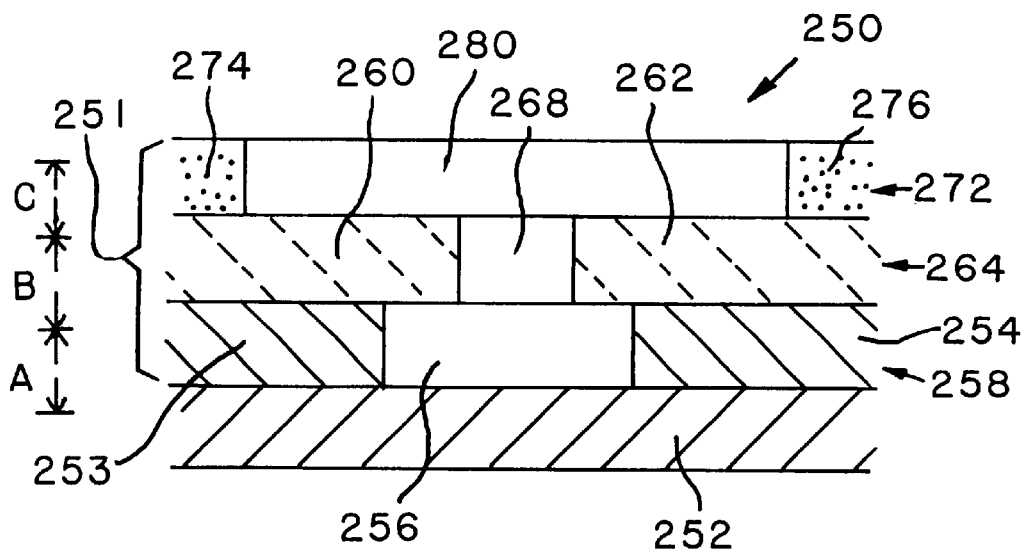
FIG. 4 illustrates a cross-sectional view of a high-temperature semiconducting integrated circuit according to the invention and formed from a single HTS layer.

Referring to FIG. 4, a third HTS integrated rated circuit 250 according to the invention includes a single HTS film or layer 251 patterned and deposited on a substrate 252. In a first implantation step, using a first photoresist/mask, high-energy deep-range ions are implanted into regions 253 and 254 to delineate a first HTS region 256 having a thickness "A" in a lower portion 258 of HTS film or layer 251 adjacent substrate 252. Regions 253 and 254 are transformed during ion implantation into relatively high-resistance, non-superconducting regions or dielectric.

In a second implantation step, using a second photoresist/mask medium-energy, medium-range ions are implanted to create non-superconducting dielectric regions 260 and 262 in a middle portion 264 (having a thickness "B") of single HTS film or layer 251. A contact region 268 remains unaffected (superconducting) by the medium-energy, medium-range (or second) ion implantation step.

In a third implantation step, using a third photoresist/mask, low-energy, low-range ions are implanted in a top portion 272 (having a thickness "C") to create dielectric or high-resistance, nonsuperconducting regions 274 and 276 and to delineate a second unaltered HTS region 280. Alternatively, regions 274 and 276 can be removed using a wet or dry etch step if desired (for example reactive ion etching, ion milling, etc.) instead of the third implantation step.

As can be appreciated from FIG. 4, first HTS region 256 is typically wider than contact region 268. Therefore, the high energy, deep-range ions used in the first implantation step to alter regions 253 and 254 do not damage contact region 268. Some damage occurs to regions 260 and 262 of middle portion 264 due to the high energy, deep-range ions implanted in regions 253 and 254. Similarly, some physical damage occurs to second HTS region 280 and regions 274 and 276 due to the high energy, deep-range ions and the medium-energy, medium-range ions. However, first HTS region 256 and contact 268 remain "virgin", Annealing can be used to restore the superconducting characteristics of second HTS region 280 if required.

Figure 5:
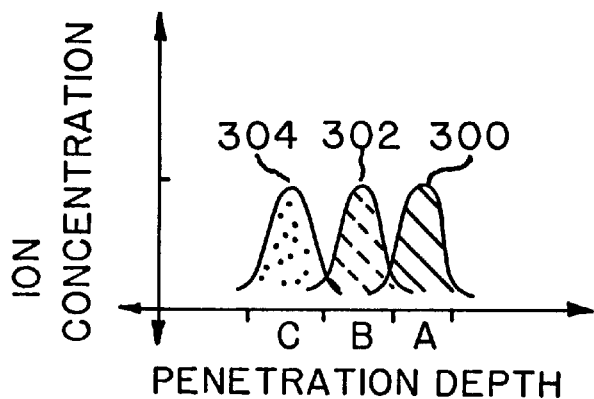
FIG. 5 illustrates ion energies of ions used in fabricating HTS integrated circuit of FIG. 4.

Referring to FIG. 5, ion concentrations of first, second and third implantation steps at 300, 302 and 304 respectively, are shown as a function of penetration depth. As can be appreciated, the implanted ions preferably have a low straggle or distribution ($\sigma$). A, B, and C correspond to the thickness of bottom, middle and top portions 258, 264 and 272.

The species of the ions used to implant during the ion implantation steps 1–3 should be selected to minimize physical damage to upper portions of HTS film or layer 251, specifically where second HTS region 280 is to be delineated. Minimizing physical damage reduces or eliminates annealing required to restore superconducting characteristics of second HTS region 280.

As can be appreciated, multi-layer and single layer planar HTS integrated circuits according to the invention reduce the likelihood of short circuits, line discontinuity, breakage, and reduction in superconducting carrying ability ($J_c$) over conventional HTS integrated circuits. In addition, implanting a single HTS layer 251 as described above in conjunction with FIG. 4 eliminates problems associated with chemical etching and/or ion cleaning of the top interface surface of dielectric 22 and first HTS layer 18 of HTS integrated circuit 10 according to the prior art.

HTS integrated circuit 250 simplifies fabrication of HTS integrated circuits. Only a thick layer of HTS film 251 is deposited and patterned initially. As such, crystal lattice mismatch and crystal growth orientation/interface problems can be avoided. Contact 268 is superconductive and has the exact HTS film properties of first and second HTS regions 256 and 280. Contact 268 is a "virgin area" with no artificially created interfaces. As such, contact 268 is superconductive and can carry high superconducting current density.

Since the single HTS layer 251 of HTS integrated circuit 250 can be deposited and patterned in one step, second HTS region 280 has almost identical characteristics as first HTS layer 256. By uniformly implanting middle portion 264 to create contact region 268 and altered regions 260 and 262 instead of using thin film deposition techniques, the middle portion 264 (or dielectric and contact) is less susceptible to growth related problems such as pin holes and cracks which are defects in the dielectric film. As such, the HTS integrated circuits according to the invention provide simple fabrication, lower defect rates, lower cost and better device performance and characteristics.

The various advantages of the present invention will become apparent to those skilled in the art after a study of the foregoing specification and following claims.

What is claimed is:

1. A method of fabricating a planar integrated circuit having a superconductive via contact between different superconducting layers in a single high temperature superconducting oxide film, said method comprising:

depositing a layer of oxide superconducting film on a substrate;

forming a first interconnect layer in lower portions of the film including the step of bombarding selected portions of the film with ions at a first energy level to transform said portions into non-superconducting regions, said first interconnect layer having a superconducting contact of given width and adjacent non-conducting regions;

forming a second layer in the same film by bombarding selected portions of the film with ions at a second energy level, less than said first energy level, to transform portions of the film above said first layer into non-superconducting regions, said second layer having a second superconducting contact overlying the first superconducting contact in the first layer, said second superconducting contact having adjacent non-superconducting regions;

thereafter, forming a third interconnect layer including the step of bombarding selected portions of the same film with ions at a third energy level, less than the second energy level, to transform portions of the film above the second layer into non-superconducting regions, said third layer having a third superconducting contact overlying the second superconducting contact, and said third superconducting contact having adjacent non-superconducting regions; and whereby the second superconducting contact serves as a via between the first and second superconducting contacts, the integrated circuit having substantially the same crystal lattice structure throughout the film.

2. The method of claim 1 wherein the first superconducting contact is wider than the second superconducting contact.

3. The method of claim 2 wherein the third superconducting contact is wider than the second and first superconducting contacts.

* * * * *